United States Patent
Wang et al.

(10) Patent No.: US 8,507,330 B2
(45) Date of Patent: Aug. 13, 2013

(54) THIN FILM TRANSISTOR

(75) Inventors: Chunmei Wang, Singapore Science Park II (SG); Wei Beng Ng, Singapore Science Park II (SG); Takehisa Ishida, Singapore Science Park II (SG)

(73) Assignee: Sony Corporation, Tokyo (JP)

( * ) Notice: Subject to any disclaimer, the term of this patent is extended or adjusted under 35 U.S.C. 154(b) by 353 days.

(21) Appl. No.: 12/845,057

(22) Filed: Jul. 28, 2010

(65) Prior Publication Data

US 2011/0031490 A1  Feb. 10, 2011

(30) Foreign Application Priority Data

Aug. 5, 2009  (SG) ................ 200905283-8

(51) Int. Cl.
*H01L 21/84* (2006.01)

(52) U.S. Cl.
USPC .......... 438/151; 438/104; 257/E29.296; 257/E21.46; 257/E21.704

(58) Field of Classification Search
USPC .......... 438/104, 151; 257/40, 43, 57
See application file for complete search history.

(56) References Cited

U.S. PATENT DOCUMENTS

| | | | |
|---|---|---|---|
| 2004/0238816 A1* | 12/2004 | Tano et al. | 257/40 |
| 2007/0117282 A1 | 5/2007 | Saito et al. | |
| 2007/0184576 A1* | 8/2007 | Chang et al. | 438/104 |
| 2008/0023698 A1* | 1/2008 | Li et al. | 257/43 |
| 2008/0032444 A1* | 2/2008 | Wu et al. | 438/104 |
| 2008/0242112 A1* | 10/2008 | Wu et al. | 438/781 |
| 2008/0286907 A1* | 11/2008 | Li et al. | 438/141 |
| 2008/0315199 A1 | 12/2008 | Toyota et al. | |
| 2010/0084643 A1* | 4/2010 | Hirai | 257/40 |
| 2010/0090201 A1* | 4/2010 | Liu et al. | 257/40 |
| 2011/0017997 A1* | 1/2011 | Kamath et al. | 257/66 |
| 2012/0058597 A1* | 3/2012 | Anthopoulos et al. | 438/104 |

FOREIGN PATENT DOCUMENTS

| | | |
|---|---|---|
| CN | 101330023 | 12/2008 |
| JP | 2002-280564 | 9/2002 |
| JP | 2008-3000791 | 12/2008 |

OTHER PUBLICATIONS

SG Examination Report issued on Mar. 26, 2012, in connection with counterpart SG Application No. 200905283-8.

* cited by examiner

*Primary Examiner* — A. Sefer
(74) *Attorney, Agent, or Firm* — Dentons US LLP

(57) ABSTRACT

A method is proposed for producing a thin-film transistor (TFT), the method comprising forming a substrate, applying a ZnO-based precursor solution onto the substrate to form a ZnO-based channel layer, annealing the channel layer, forming a source electrode and a drain electrode on the channel layer, forming a dielectric layer on the channel layer and forming a gate electrode on the dielectric layer.

15 Claims, 7 Drawing Sheets

THIN FILM TRANSISTOR

FIELD OF THE INVENTION

The present invention relates to a thin-film transistor (TFT) and a method of fabrication, particularly though not solely to a TFT with a solution-processed channel layer and/or dielectric layer.

BACKGROUND

Thin-film transistors (TFT) are a form of field effect transistors made by depositing thin films of semiconductor material over a substrate. One application for TFTs is TFT liquid crystal displays (TFT-LCD). TFT-LCDs are used for televisions, computers, mobile phones, handheld devices and projectors.

Previously, TFTs were fabricated with a channel layer made of amorphous silicon, microcrystalline silicon or polysilicon. More recently, TFT with a ZnO-based channel layer have been shown to exhibit superior performance, simpler fabrication complexity, better transparency, lower light sensitivity and lower light degradation. However, manufacturing the ZnO-based channel layer may require high temperature and vacuum processing which may be costly. Alternatively the ZnO-based channel layer may be made using nanotubes, nanowires or nanorods of ZnO, but this may require the alignment of the nanotubes, nanowires or nanorods which may be difficult and/or costly.

SUMMARY OF THE INVENTION

In general terms, the invention proposes using solution processing to fabricate a ZnO-based channel layer in a TFT. Additionally, the dielectric may be an organic polymer and the TFT may be of a dual-gate top-contact structure. This may have the advantage that the channel layer is easily produced using a precursor solution, without the need for high vacuum or for high temperature. The dielectric layer may be made of a poly-4-vinylphenol (PVP) that may have the advantage of being low temperature solution-processable with a dielectric strength proven to be similar to that of thermally grown silicon oxide. Also precise alignment against the electrodes may not be required. Low-cost, transparent and flexible displays incorporating one or more embodiments can be used as transparent and bendable active matrix displays or display panels in the shield windows of cars.

In a first particular expression of the invention there is provided a method for producing a TFT as recited in claim 1.

In a second particular expression of the invention there is provided a TFT as recited in any of the claims.

The invention may also be implemented as recited in any of the claims.

BRIEF DESCRIPTION OF THE DRAWINGS

By way of example only, one or more embodiments will be described with reference to the accompanying drawings, in which.

DETAILED DESCRIPTION

Figure 1:
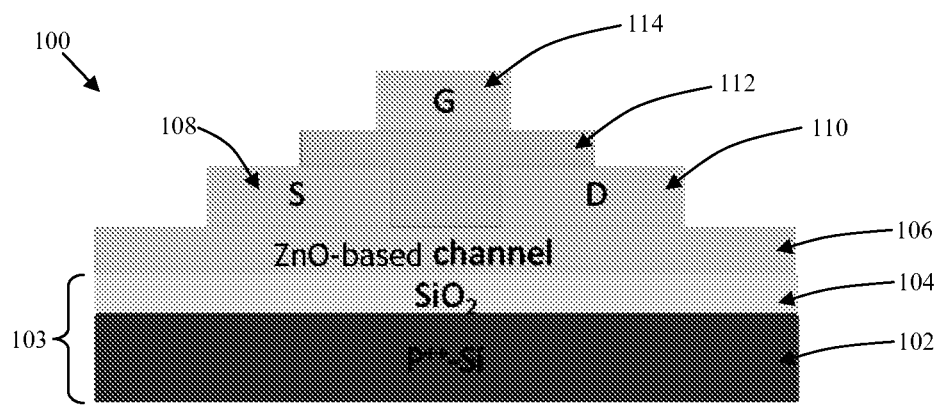
FIG. 1 is a schematic drawing of the cross-section of the dual-gate top-contact TFT structure according to an example embodiment.

FIG. 1 shows a dual-gate thin-film transistor (TFT) 100 according to an example embodiment. The TFT 100 comprises a substrate 103 including a highly B-doped Si (p-type) layer 102 and a silicon dioxide ($SiO_2$) layer 104, a zinc oxide (ZnO) based channel layer 106 on the $SiO_2$ layer 104, source 108 and drain 110 electrodes on the channel layer 106, an organic polymer-based dielectric layer 112 on the channel layer 106, and a gate electrode 114 on the dielectric layer 112.

The p-type layer 102 may have a resistivity of 0.001~0.006 Ω·cm. Alternatively, this layer may be transparent glass, or polymer substrates that are transparent and flexible. The p-type layer 102 is approximately 500 μm thick. The $SiO_2$ layer 104 is approximately 100 nm thick and functions as a bottom-gate dielectric layer.

The channel layer 106 may be ZnO, ZnInO, ZnSnO or InSnO and has an amorphous structure. The channel layer 106 may alternative also comprise of a Ga-based oxide. If the channel layer 106 is ZnInO or ZnSnO, the molar ratio of In or Sn may be in the range of 0.01 to 0.99. The channel layer 106 may be 50 nm thick after annealing.

The source 108 and drain 110 electrodes may be metallic e.g.: Al, Au, Au/Ti, Zn, Mo or Ag, or inorganic and/or organic conductive inks. The source 108 and drain 110 electrodes may be 100 nm thick. The source 108 and drain 110 electrodes are 180 μm apart.

The dielectric layer 112 is an organic polymer, for example poly-4-vinylphenol (PVP), poly-vinyl-cinemate (PVCi) or poly-methyl-methacrylate (PMMA), or a combination of polymers such as poly-4-vinylphenol (PVP) and Benzocyclobutane (BCB). PVP may be advantageous as it is low temperature solution-processable and its dielectric strength may be similar to that of thermally grown silicon oxide. The dielectric layer 112 is 300 nm thick above the source 108 and drain 110 electrodes.

The gate electrode(s) 114 are approximately 100 nm think and may be metallic e.g.: Al, Au, Au/Ti, Zn, Mo or Ag, or inorganic and/or organic conductive inks.

Figure 2:
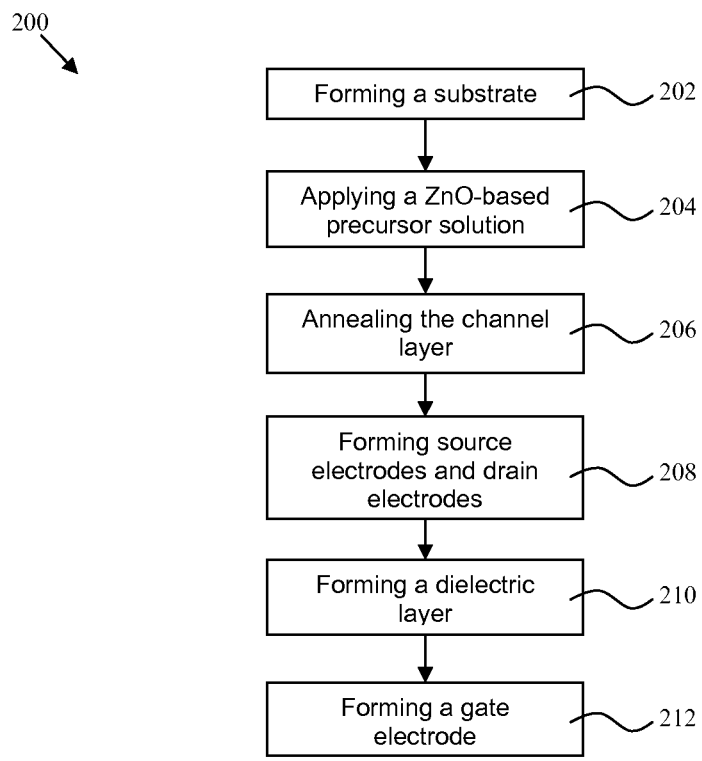
FIG. 2 is a flow diagram of the method of fabricating the TFT according to the example embodiment.

FIG. 2 shows a method 200 of fabricating the TFT according to the example embodiment. The method 200 comprises forming a substrate in 202, applying a ZnO-based precursor solution onto the substrate to form a channel layer in 204, annealing the channel layer in 206, forming source and drain electrodes in 208, forming the dielectric layer in 210 and forming the gate electrode in 212.

The method 200 of fabricating the TFT according to the example embodiment is now described to a greater detail with the aid of FIGS. 3 to 7.

Figure 3:
FIG. 3 is a schematic drawing of the cross-section of the TFT being manufactured during the forming of a substrate.

FIG. 3 shows an example of how the substrate 103 is formed in 202. First a 1"×1" p-type layer 102 is provided. Secondly a $SiO_2$ layer 104 is thermally grown on the surface of the p-type layer 102. The $SiO_2$ layer 104 is cleaned using a piranha solution (with the ratio of $H_2SO_4$ to $H_2O_2$=2:1) for 10 minutes followed by ultrasonication in a 1M NaOH solution for 10 minutes to provide a hydrophilic surface. This is followed by a blow dry using $N_2$ gas and hot plate baking at 80° C.

Figure 4:
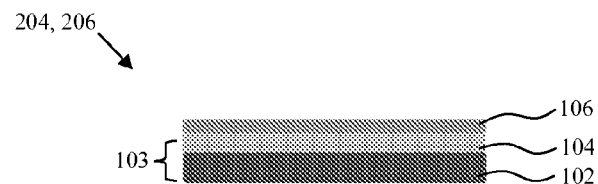
FIG. 4 is a schematic drawing of the cross-section of the TFT being manufactured during the applying of a ZnO-based precursor solution to form a channel layer and annealing the channel layer.
Figure 5:
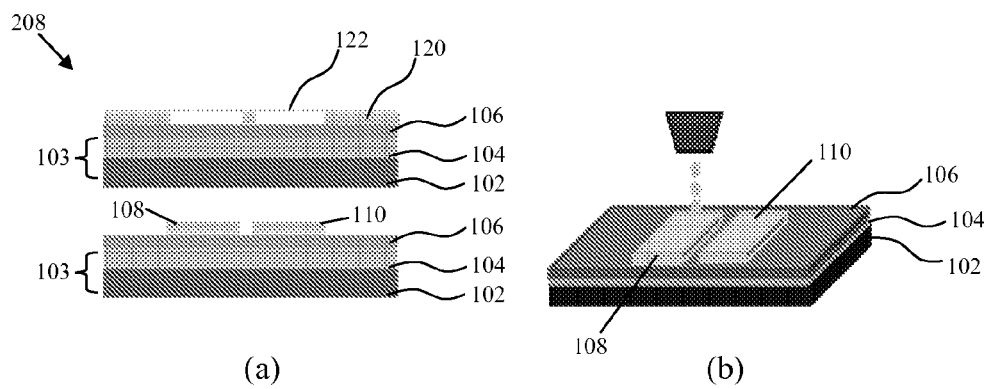
FIG. 5(a) is a schematic drawing of the cross-section of the TFT being manufactured during the forming of source and drain electrodes by way of spin coating.
FIG. 5(b) is a schematic drawing of the cross-section of the TFT being manufactured during the forming of source and drain electrodes by way of inkjet printing.
Figure 6:
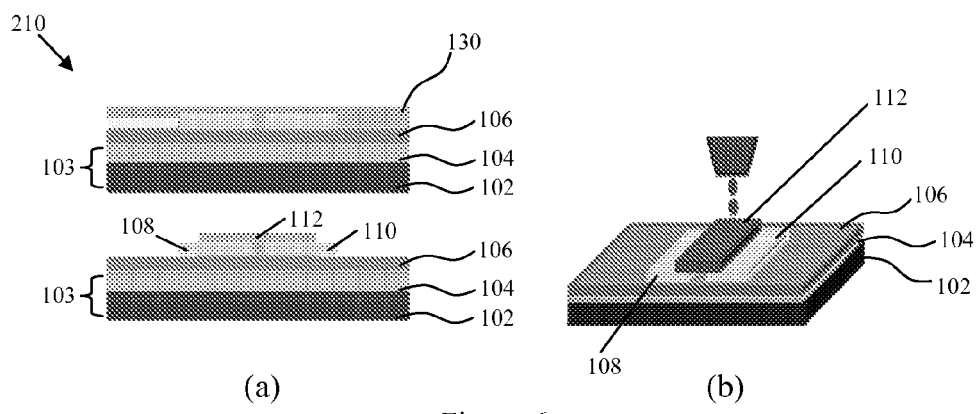
FIG. 6(a) is a schematic drawing of the cross-section of the TFT being a) manufactured during the forming of a dielectric layer by way of spin coating.
FIG. 6(b) is a schematic drawing of the cross-section of the TFT being manufactured during the forming of a dielectric layer by way of inkjet printing.
Figure 7:
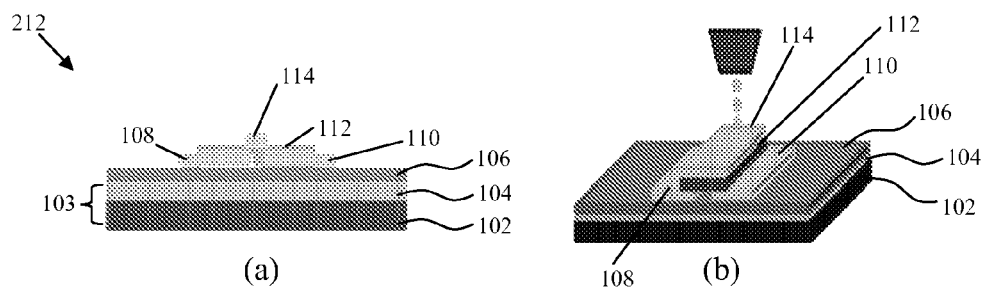
FIG. 7(a) is a schematic drawing of the cross-section of the TFT being manufactured during the forming of a gate electrode by way of spin coating.
FIG. 7(b) is a schematic drawing of the cross-section of the TFT being manufactured during the forming of a gate electrode by way of inkjet printing.

FIG. 4 shows an example of forming a channel layer 204 onto the $SiO_2$ layer 104. First, metal halides such as zinc chloride, tin chloride or indium chloride are dissolved in ethyl acetate and sonicated for 15 minutes to fully dissolve.

The ZnO-based precursor solution is spin coated on top of the $SiO_2$ layer 104 producing the channel layer 106. The spin coating is performed at 4000 rounds per minute (rpm) for 30 seconds. Alternatively, the ZnO-based precursor solution can be applied using drop casting or inkjet printing. Drop casting drops the precursor solution directly onto the $SiO_2$ layer 104. After deposition, the sample is then baked on a hot plate at 200° C. for 1 hour under air. The ZnInO thin film after baking is 50 nm thick.

Annealing 206 is performed at a temperature higher than 200° C. but lower than 400° C. for at least 1 hour. This induces the formation and growth of the channel layer 106. The channel layer 106 is about 50 nm thick after annealing.

FIG. 5(a) shows an example method 208 for forming the source 108 and drain 110 electrodes. A layer of 100 nm-thick metal 120 for the source/drain electrodes is thermally evaporated using the gas phase deposition process on top of the channel layer 106. The source/drain electrodes 108,110 may then be patterned through a shadow mask 122 or by using other standard photolithography techniques.

FIG. 5(b) shows another example method 208 for forming the source 108 and drain 110 electrodes where conductive inks are inkjet printed on top of the channel layer 106 to form the source/drain electrodes 108,110.

If fabrication stops after 208, the resultant device will be a basic bottom-gate top-contact TFT structure.

Forming the dielectric layer 210 starts with preparing an organic polymer-based precursor solution with 10 wt. % poly-4-vinylphenol powder (molecular weight Mw=20000), 12.5 wt. % poly (melamine-co-formaldehyde) as a cross-linking agent and 77.5 wt. % propylene glycol monomethyl ether acetate (PGMEA) as the solvent.

Alternatively, the solvent used for the organic polymer-based precursor solution can be any of n-butanol, 1-propanol, n-methylpyrrolidone (NMP) or acetone.

FIG. 6(a) shows how the precursor solution may be applied to the channel layer 106. The precursor solution is spin coated at 4000 rpm for 60 seconds to cover the channel layer 106 and the patterned source and/or drain electrodes 108,110. The sample is then baked on a hot plate (i.e. heat cross-linked) at 100° C. for 5 minutes under air.

The PVP layer 130 is patterned using ultra-violet light ($\lambda$=352 nm) through a shadow mask. The PVP layer 130 is exposed under ultra-violet light for 6 minutes at a distance of 18 cm from the light source with a UV power density of 1 mW/cm². Since PVP is a negative photo resist, the exposed part will become cross-linked while the part protected by the shadow mask will not be cross-linked. The PVP layer 130 is immersed into PGMEA solvent and the exposed part will remain forming the dielectric layer 112 while the uncured shadow mask protected part will dissolve and be washed away by the solvent.

In place of spin coating, the process of drop casting or inkjet printing can also be used to form the PVP layer 130. FIG. 6(b) shows another example method 210 for forming the dielectric layer 112 where the dielectric layer 112 is produced and patterned using direct inkjet printing.

In order to fully cross-link the PVP and improve its dielectric strength, the sample after patterning is put into a vacuum oven with pressure of approximately 0.1 Torr for heat curing at 100° C. for 5 minutes, and then between 175 to 200° C. for between 30 minutes to 1 hour.

FIG. 7(a) shows an example method 212 for forming the gate electrode 114 where a top-gate electrode is formed by thermal evaporation using the gas phase deposition process. Patterning may be done through a shadow mask or by using other standard photolithography techniques.

FIG. 7(b) shows an alternative example method 212 of forming the gate a) electrode 114 by using a direct printing methodology such as using inkjet printing.

The result of 212 is a dual-gate top-contact TFT 100.

Figure 8:
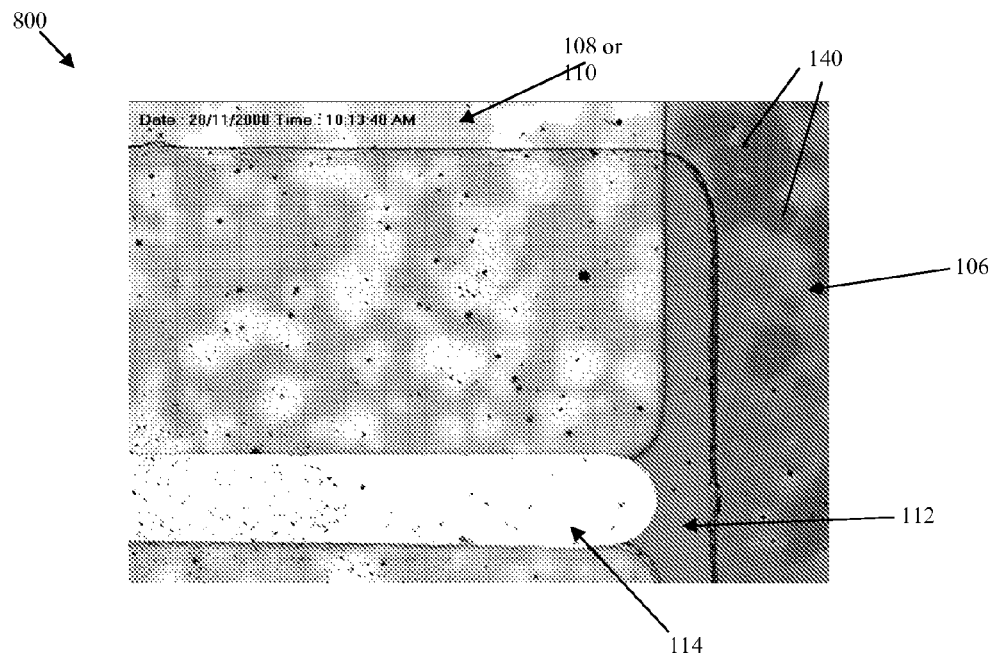
FIG. 8 is the top view optical image of a ZnInO top-gate TFT with patterned PVP as the gate dielectric.

FIG. 8 shows an optical image 800 of a resultant dual-gate top-contact TFT device 100 pictured top down. The patterned dielectric layer 112 has been patterned to have a rectangular shape by UV exposure through a shadow mask. The source or drain electrodes 108 or 110 is thus exposed, allowing for electrical contact to be made for I-V testing after the PVP is patterned. The gate electrode 114 is aligned alongside the source or drain electrode 108 or 110, allowing for an overlap of approximately 15 μm. The channel layer 106 is smooth and uniform and different colour shades in the film arises from its varying thickness. The randomly distributed black dots 140 are assumed to be the voids formed inside the film during the annealing process and will not affect the continuity of the film.

Figure 9:
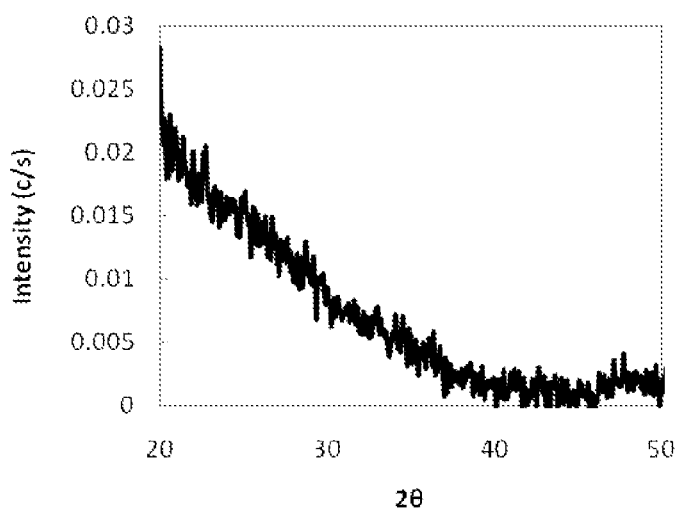
FIG. 9 is the x-ray diffraction (XRD) pattern of the ZnInO channel prepared by the precursor solution process.

The x-ray diffraction (XRD) pattern shown in FIG. 9 exhibits no high and sharp main peaks when the scan range is from 20° to 50°. This suggests that the channel layer 106 resulting from the process of spin coating using the precursor solution is amorphous.

Figure 10A:
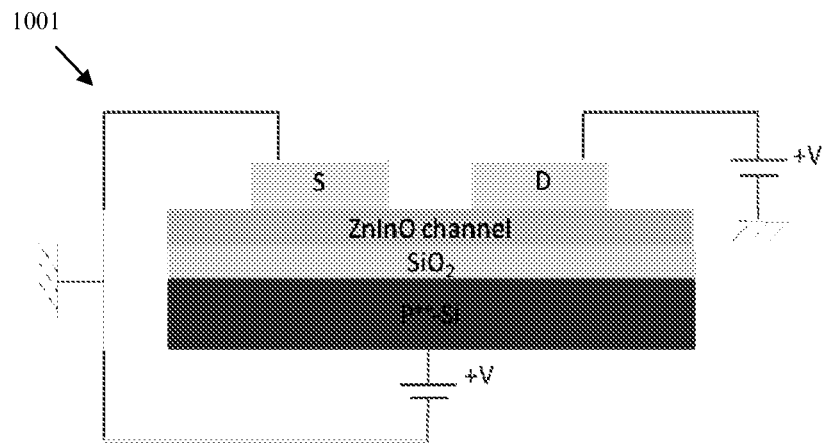
FIG. 10(a) is a schematic drawing of the electrical connection for the I-V measurements of a bottom-gate TFT with ZnInO channel layer.
Figure 10B:
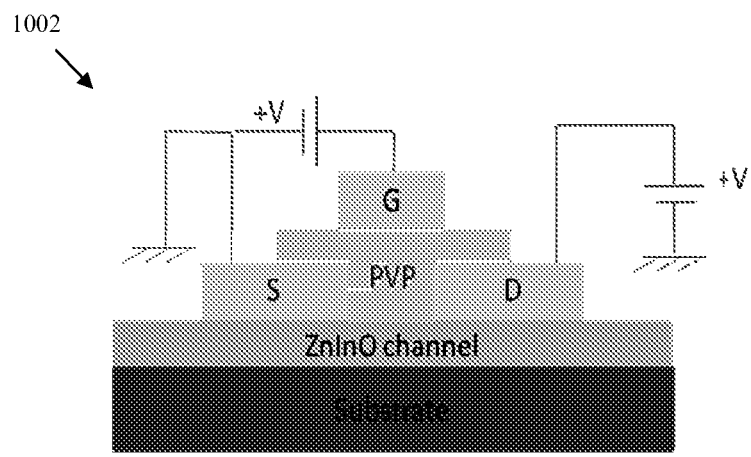
FIG. 10(b) is a schematic drawing of the electrical connection for the I-V measurements of a top-gate TFT with ZnInO channel layer.

The electrical performance of the dual-gate ZnInO TFT 100 with PVP as a top-gate dielectric was characterized by a semiconductor parameter analyzer, Keithly 4200, in the air and in the dark. In order to know whether the ZnInO is working as a semiconductor, the bottom-gate TFT with $SiO_2$ as the bottom gate dielectric was tested first. The electrical connections used for characterizing the performance of the bottom-gate TFT 1001 and the top-gate TFT 1002 are depicted in FIGS. 10(*a*) and 10(*b*) respectively. For the bottom-gate device, the drain current-drain voltage ($I_d$-$V_d$) output characteristics and the drain current-gate voltage ($I_d$-$V_g$) transfer characteristics are presented in FIG. 10(*a*) and FIG. 10(*b*) respectively.

Figure 11A:
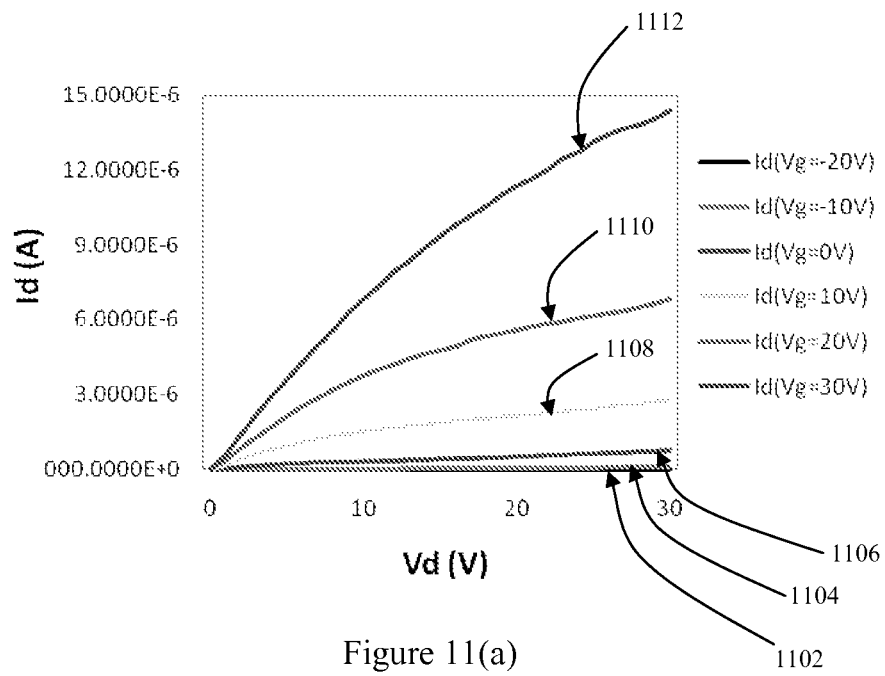
FIG. 11(a) is a graph of the drain current-drain voltage ($I_d$-$V_d$) output characteristics of the bottom-gate ZnInO TFT shown in FIG. 10(a)
Figure 11B:
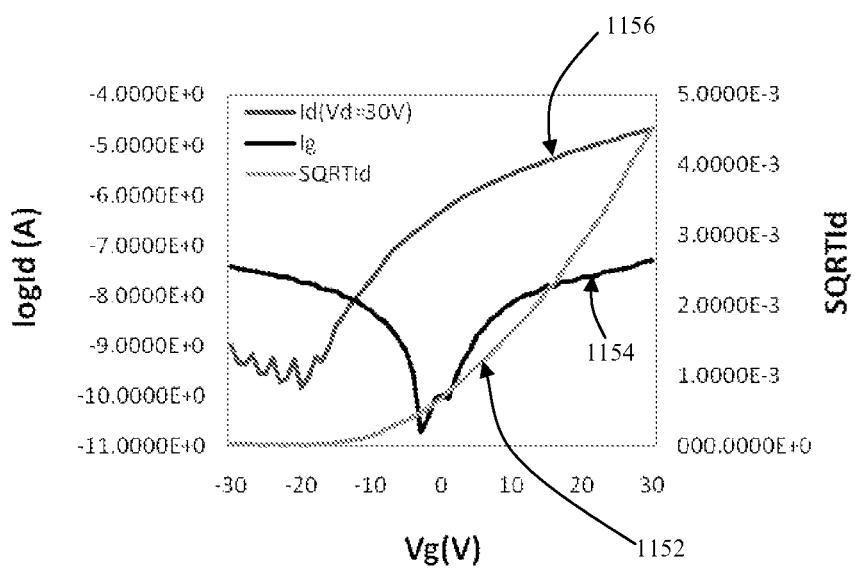
FIG. 11(b) is a graph of the drain current-gate voltage ($I_d$-$V_g$) transfer characteristics of the bottom-gate ZnInO TFT shown in FIG. 10(a)

FIG. 11(*a*) is a graph of the drain current-drain voltage ($I_d$-$V_d$) output characteristics of the bottom-gate ZnInO TFT shown in FIG. 10(*a*). The $V_d$ axis runs from 0V to 30V and curves representing $V_g$ bias values of −20V (curve 1102), −10V (curve 1104), 0V (curve 1106), 10V (curve 1108), 20V (curve 1110) and 30V (curve 1112) are presented. The $I_d$-$V_d$ curves show that the ZnInO TFT behaves as an n-channel transistor operating in a depletion mode, with good gate modulation and saturation at $V_d \geq 30V$. A saturation current of $1.5\times10^{-5}$ A was obtained under a gate bias of 30V i.e. curve 1112.

FIG. 11(*b*) is a graph of the drain current-gate voltage ($I_d$-$V_g$) transfer characteristics of the bottom-gate ZnInO TFT shown in FIG. 10(*a*). The $V_g$ axis runs from −30V to 30V and the $V_d$ bias is 30V. The gate current $I_g$ (curve 1154), the square root of the output current SQRTId (curve 1152) and the output current $I_d$ (curve 1156) as $V_g$ is varied are shown in the respective curves. From the $I_d$ curve 1156 of FIG. 11(*b*), the output current is seen to reach 0.5 μA at $V_g$=0V. The channel can only be fully depleted at $V_g$=−20 V and the device starts to turn on at $V_g$=−20 V. This result again proves that the TFT operates in a depletion mode.

The field-effect mobility $\mu_{FE}$ of ZnInO TFT operating in the saturation region can be computed using equation 1:

$$I_D = \frac{1}{2}\frac{w}{l}\mu_{FE}C_i(V_g - V_{th})^2 \quad (1)$$

where $C_i$ is the capacitance per unit area of the gate insulator, $V_{th}$ is the threshold voltage. Here for this embodiment, the insulator for the bottom-gate structure is $SiO_2$ with a $C_i$ of 26.5 nF/cm$^2$. $V_{th}$ here is −3.8 V, the channel width w is 1696 μm, the channel length l is 180 μm, the output current $I_D$ is $2.05\times10^{-5}$ A and the gate voltage $V_g$ is 30V. The field-effect mobility ($\mu_{FE}$) of the bottom-gate ZnInO TFT is computed to be 0.24 cm$^2$/Vs.

Another important device parameter is the on/off current ratio. From FIG. 11(*b*), the off-current is seen to be about $1.48\times10^{-10}$ A while the on-current is $2.05\times10^{-5}$, thus obtaining a high on/off current ratio of $1.4\times10^5$.

Figure 12A:
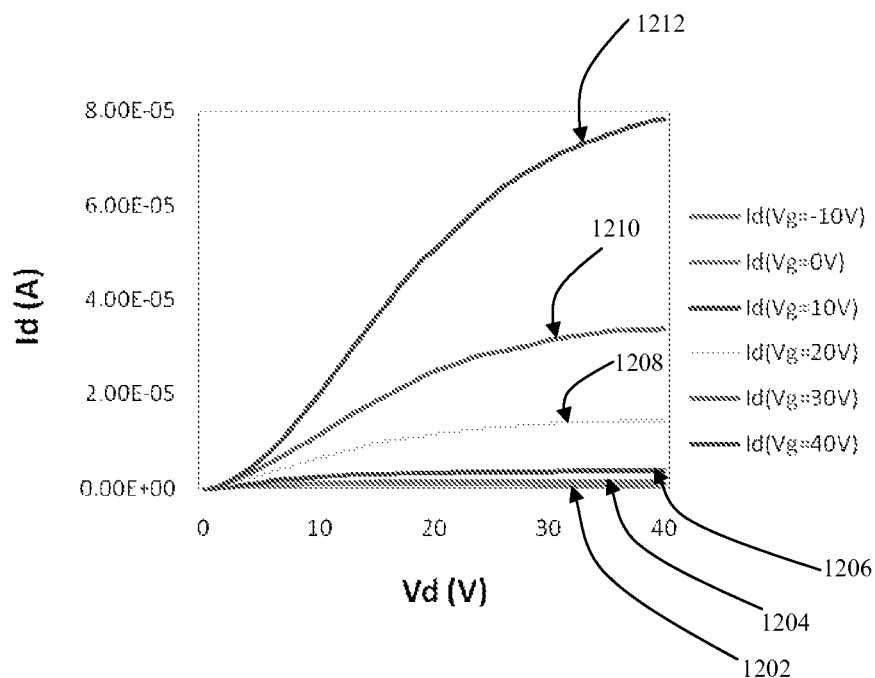
FIG. 12(a) is a graph of the drain current-drain voltage ($I_d$-$V_d$) output characteristics of the top-gate ZnInO TFT shown in FIG. 10(b)
Figure 12B:
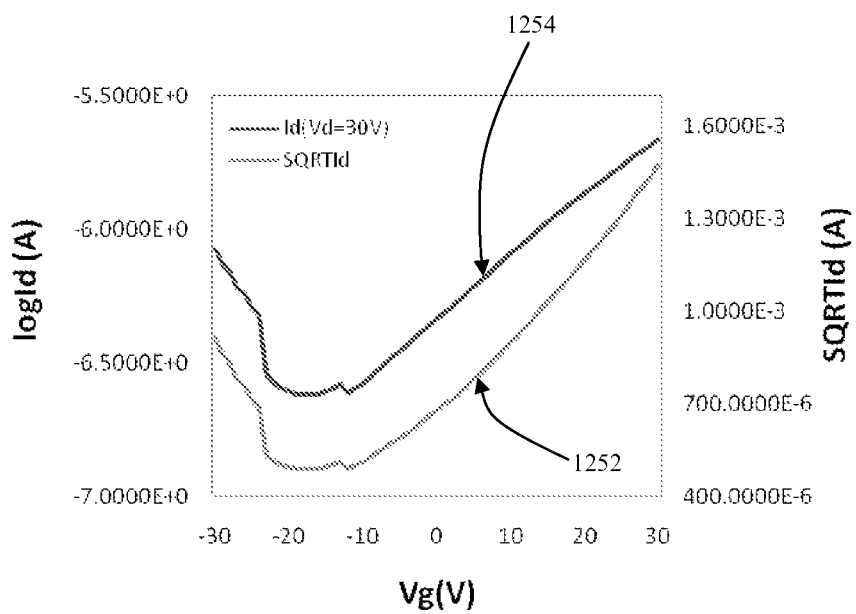
FIG. 12(b) is a graph of the drain current-gate voltage ($I_d$-$V_g$) transfer characteristics of the top-gate ZnInO TFT shown in FIG. 10(b).

FIG. 12(*a*) is a graph of the drain current-drain voltage ($I_d$-$V_d$) output characteristics of the top-gate ZnInO TFT shown in FIG. 10(*b*). $V_d$ runs from 0V to 40V and curves representing $V_g$ bias values of −10V (curve 1202), 0V (curve 1204), 10V (curve 1206), 20V (curve 1208), 30V (curve 1210) and 40V (curve 1212) are presented. Saturation behavior can be clearly observed at $V_d \geq 30V$. A saturation output current of 80 μA was obtained at $V_g$=40V.

FIG. 12(*b*) is a graph of the drain current-gate voltage ($I_d$-$V_g$) transfer characteristics of the top-gate ZnInO TFT shown in FIG. 10(*b*). $V_g$ runs from −30V to 30V and the $V_d$ bias is 30V. As $V_g$ is varied, curve 1252 shows the square root of the output current SQRTId and curve 1254 shows the output current $I_d$. The top-gate ZnInO TFT operates in a depletion mode since the output current $I_d$ curve 1254 is a high value of $4.6\times10^{-7}$ A when $V_g$=0V. The device started to turn on when $V_g$ is around −12V.

The field-effect mobility $\mu_{FE}$ of the top-gate ZnInO TFT was computed to be 0.074 cm$^2$/Vs using equation (1). $C_i$ in this case is the capacitance per unit area of the PVP layer, which is only 3 nF/cm$^2$. It can also be seen that the off-current was very high ($4.62\times10^{-7}$ A at $V_g$=0V) while the on-current was 2.2 μA, which results in the very low on/off current ratio of approximately 10. The high off-current is partially caused by the UV induced photocurrent on the very top surface of ZnInO channel when patterning the top gate dielectric PVP layer by UV, and the relatively high gate leakage current through the PVP top gate dielectric. The higher saturation output current of $2.2\times10^{-6}$ A at $V_g$=30V was also caused by the UV induced photocurrent.

While example embodiments of the invention have been described in detail, many variations are possible within the scope of the invention as will be clear to a skilled reader.

LIST OF REFERENCE NUMBERS

| | |
|---|---|
| 100 | thin-film transistor (TFT) |
| 102 | p-type layer |
| 103 | substrate |
| 104 | $SiO_2$ layer |
| 106 | channel layer |
| 108 | source electrode |
| 110 | drain electrode |
| 112 | dielectric layer |
| 114 | gate electrode |
| 120 | layer of metal for the source/drain electrodes |
| 122 | shadow mask |
| 130 | PVP layer |
| 140 | voids |
| 200 | method of fabrication |
| 202 | forming a substrate |
| 204 | forming a channel layer |
| 206 | annealing the channel layer |
| 208 | forming source and drain electrodes |
| 210 | forming a dielectric layer |
| 212 | forming a gate electrode |
| 800 | optical image of a TFT |
| 1001 | bottom-gate TFT |
| 1002 | top-gate TFT |
| 1102 | $I_d$ ($V_g$ = −20 V) curve of the bottom-gate TFT |
| 1104 | $I_d$ ($V_g$ = −10 V) curve of the bottom-gate TFT |
| 1106 | $I_d$ ($V_g$ = 0 V) curve of the bottom-gate TFT |
| 1108 | $I_d$ ($V_g$ = 10 V) curve of the bottom-gate TFT |
| 1110 | $I_d$ ($V_g$ = 20 V) curve of the bottom-gate TFT |
| 1112 | $I_d$ ($V_g$ = 30 V) curve of the bottom-gate TFT |
| 1152 | SQRTId curve of the bottom-gate TFT |
| 1154 | $I_g$ curve of the bottom-gate TFT |
| 1156 | $I_d$ ($V_d$ = 30 V) curve of the bottom-gate TFT |
| 1202 | $I_d$ ($V_g$ = −10 V) curve of the top-gate TFT |
| 1204 | $I_d$ ($V_g$ = 0 V) curve of the top-gate TFT |
| 1206 | $I_d$ ($V_g$ = 10 V) curve of the top-gate TFT |
| 1208 | $I_d$ ($V_g$ = 20 V) curve of the top-gate TFT |
| 1210 | $I_d$ ($V_g$ = 30 V) curve of the top-gate TFT |
| 1212 | $I_d$ ($V_g$ = 40 V) curve of the top-gate TFT |
| 1252 | SQRTId curve of the top-gate TFT |
| 1254 | $I_d$ ($V_d$ = 30 V) curve of the top-gate TFT |

The invention claimed is:

1. A method for producing a thin-film transistor (TFT) comprising, in this order:
    forming a substrate;
    applying a metal oxide-based precursor solution onto the substrate to form a metal oxide-based channel layer;
    annealing the channel layer;
    forming a source electrode and a drain electrode on the channel layer;
    forming a dielectric layer on the channel layer; and
    forming a gate electrode on the dielectric layer, wherein,
forming the dielectric layer further comprises baking the dielectric layer using a hot plate, patterning the dielectric layer using ultra-violet light and a shadow mask, and heat curing the dielectric layer in a vacuum oven.

2. The method according to claim 1 wherein the applying the metal oxide-based precursor solution comprises a process selected from the group consisting of:
spin coating the metal oxide-based precursor solution;
drop casting the metal oxide-based precursor solution; and
inkjet printing the metal oxide-based precursor solution.

3. The method according to claim 2 wherein the metal oxide-based precursor solution comprises a solute selected from the group consisting of:
zinc chloride;
tin chloride;
indium chloride; and
any combination thereof 4. The method according to any of the preceding claims wherein the metal oxide-based channel layer is a ZnO-based channel layer.

5. The method according to claim 1 wherein the annealing the channel layer is done at a temperature lower than or equal to 400° C.

6. The method according to claim 5 wherein the annealing the channel layer is done at a temperature greater than or equal to 20020 C.

7. The method according to claim 1 wherein the dielectric layer is an organic polymer-based dielectric layer.

8. The method according to claim 7 wherein the dielectric layer is selected from the group consisting of:
a poly-4-vinylphenol (PVP) layer;
a poly-4-vinylphenol (PVP) and Benzocyclobutane (BCB) layer;
a poly-vinyl-cinemate (PVCi) layer; and
a poly-methyl-methacrylate (PMMA) layer.

9. The method according to any of claims 3,5,6 and 8, wherein the forming the dielectric layer comprises a process selected from the group consisting of:
spin coating with an organic precursor solution;
drop casting with the organic precursor solution; and
inkjet printing with the organic precursor solution.

10. The method according to claim 9 wherein the organic precursor solution is prepared using:
a poly-vinyl-phenol (PVP) powder;
a poly-melamine-co-formaldehyde cross-linking agent; and
a solvent.

11. The method according to claim 10 wherein the solvent is selected from the group consisting of:
propylene glycol monomethyl ether acetate (PGMEA);
n-butanol;
1-propanol;
n-methylpyrrolidone (NMP); and
acetone.

12. The method according to any of claims 3,5,6 and 8, wherein the forming the substrate comprises:
providing a B-doped Si layer; and
thermally growing a layer of $SiO_2$ on the B-doped Si Layer.

13. A method for producing a thin-film transistor (TFT) comprising, in this order:
forming a substrate;
applying a metal oxide-based precursor solution onto the substrate to form a metal oxide-based channel layer;
annealing the channel layer;
forming a source electrode and a drain electrode on the channel layer;
forming a dielectric layer on the channel layer; and
forming a gate electrode on the dielectric layer,
wherein,
forming the dielectric layer comprises a process selected from the group consisting of (a) spin coating with an organic precursor solution, (b) drop casting with the organic precursor solution, and (c) inkjet printing with the organic precursor solution, and
forming the dielectric layer further comprises baking the dielectric layer using a hot plate patterning the dielectric layer using ultra-violet light and a shadow mask and heat curing the dielectric layer in a vacuum oven.

14. A method for producing a thin-film transistor (TFT) comprising, in this order:
forming a substrate;
applying a metal oxide-based precursor solution onto the substrate to form a metal oxide-based channel layer;
annealing the channel layer;
forming a source electrode and a drain electrode on the channel layer;
forming a dielectric layer on the channel layer; and
forming a gate electrode on the dielectric layer,
wherein,
forming the dielectric layer comprises a process selected from the group consisting of (a) spin coating with an organic precursor solution, (b) drop casting with the organic precursor solution, and (c) inkjet printing with the organic precursor solution,
the organic precursor solution is prepared using (a) a poly-vinyl-phenol (PVP) powder, (b) a poly-melamine-co-formaldehyde cross-linking agent, and (c) a solvent,
the solvent is selected from the group consisting of (a) propylene glycol monomethyl ether acetate (PG-MEA), (b) n-butanol, (c) 1-propanol, (d) n-methylpyrrolidone (NMP), and (e) acetone,
forming the dielectric layer further comprises (a) baking the dielectric layer using a hot plate, (b) patterning the dielectric layer using ultra-violet light and a shadow mask, and (c) heat curing the dielectric layer in a vacuum oven, and
the heat curing the dielectric layer is done at a temperature lower than or equal to 200° C.

15. The method according to claim 14 wherein the heat curing the dielectric layer is done at a temperature greater than or equal to 175° C.

\* \* \* \* \*